United States Patent [19]

Iyer et al.

[11] Patent Number: 5,046,657
[45] Date of Patent: Sep. 10, 1991

[54] TAPE AUTOMATED BONDING OF BUMPED TAPE ON BUMPED DIE

[75] Inventors: Venkat Iyer, Santa Clara; Jagdish Belani, Cupertino; Hem P. Takiar, Fremont; Rajenda Pendse, Sunnyvale, all of Calif.

[73] Assignee: National Semiconductor Corporation, Santa Clara, Calif.

[21] Appl. No.: 462,857

[22] Filed: Jan. 5, 1990

Related U.S. Application Data

[63] Continuation of Ser. No. 153,870, Feb. 9, 1988, abandoned.

[51] Int. Cl.5 .................. B23K 101/40; H01L 21/603; H05K 3/32
[52] U.S. Cl. .................. 228/123; 228/180.1; 228/265; 357/70
[58] Field of Search .................. 228/123, 179, 180.1, 228/265; 357/70

[56] References Cited

U.S. PATENT DOCUMENTS

| | | | |
|---|---|---|---|
| 3,501,832 | 3/1970 | Iwata et al. | 228/180.2 |
| 4,000,842 | 1/1977 | Burns | 228/180.2 |
| 4,607,779 | 8/1986 | Burns | 228/180.2 |
| 4,707,418 | 11/1987 | Takiar et al. | 228/180.2 |

FOREIGN PATENT DOCUMENTS 0019652 2/1979 Japan .................. 228/180.2

OTHER PUBLICATIONS

"Film-Carrier Technique Automates the Packaging of IC Chips", Grossman, 5/16/74.
"BTAB's Future—An Optimistic Prognosis", 400 Solid-State Technology, vol. 23 (1980), Mar., Unger, pp. 77-83.

Primary Examiner—Samuel M. Heinrich
Attorney, Agent, or Firm—Flehr, Hohbach, Test, Albritton & Herbert

[57] ABSTRACT

A tape automated bonding structure (10) includes a copper flexible tape (12) with a plurality of conductive leads (14) having tips (16) arranged in a generally rectangular pattern corresponding to gold bumped contacts (18) on semiconductor die (20). The tips (16) of the conductive leads (14) are configured as bumps extending from the remainder of each conductive lead (14). The tips (16) of the conductive leads (14) are gang bonded to the bumped contacts (18) on the semiconductor die (20) by positioning the tips (16) in registration over each bumped contact and applying heat and pressure to urge the tips (16) and the bumped contacts together, thus forming a thermocompression bond. The harder copper tips (16) penetrate into the gold bumped contacts. The bumped contacts (18) and the remainder of the tips (16) that has not penetrated into the contacts (18) space the conductive leads (14) above surface (22) of the semiconductor die (20).

15 Claims, 3 Drawing Sheets

TAPE AUTOMATED BONDING OF BUMPED TAPE ON BUMPED DIE

This is a continuation of application Ser. No. 153,870, filed Feb. 9, 1988, now abandoned.

BACKGROUND OF THE INVENTION

1. Field of the Invention

This invention relates to an improved bonding structure and process for attaching a tape providing conductive leads to a semiconductor die having a plurality of mating contact bumps for the conductive leads. More particularly, it relates to such a structure and process which provides a stronger bond between the conductive leads and the mating contact bumps.

2. Description of the Prior Art

Tape automated bonding of semiconductor die is widely practiced in the semiconductor industry at the present time. The tape automated bonding technique is the process of choice for attaching conductive leads to contacts of high volume semiconductor parts. Representative examples of tape automated bonding structures and processes are disclosed in commonly assigned U.S. Pat. No. 4,000,842, issued Jan. 4, 1977 to Burns, in commonly assigned pending Application Serial No. 597,805, filed Apr. 5, 1984 in the name of Carmen D. Burns and entitled "Controlled Collapse Thermocompression Gang Bonding", application Ser. No. 628,106, filed July 5, 1984, in the name of Thanomsak Sankhagowit and entitled "Pretestable Semiconductor Die Package and Fabrication Method," application Ser. No. 878,930, filed June 26, 1986 in the names of Ali Emamjomeh and Richard Rice and entitled "Hinge Tape" and in U.S. Pat. No. 4,234,666. As practiced in the prior art, a bumped metallic tape has been used with semiconductor die having flat, thin bonding pads, in order to space the conductive leads above the semiconductor die surface. Conversely, when the semiconductor die has bumped contacts to space the conductive leads above the semiconductor die surface, a flat metallic tape has been used. While the tape automated bonding structure and process has been highly successful in practice, any modification that would improve results obtained with tape automated bonding would be desirable. In particular, it would be helpful to increase the bonding strength obtained with tape automated bonding and to provide a tape automated bonding structure that is not susceptible to shorting by drooping when heated to elevated temperatures in subsequent processing.

SUMMARY OF THE INVENTION

Accordingly, it is an object of this invention to provide a tape automated bonding structure and process which will provide bonds between the conductive leads and the contacts of the semiconductor die.

It is another object of the invention to provide such a structure and process for producing the structure in which the structure can be heated to elevated temperatures in subsequent processing without shorting by drooping.

The attainment of these and related objects may be achieved through use of the novel tape automated bonding structure and process herein disclosed. A tape automated bonding interconnection structure in accordance with this invention has a semiconductor die with a surface and a plurality of conductive contact bumps on the surface of the semiconductor die and extending above the surface. A like plurality of conductive interconnection leads has a principal portion with a surface facing toward the surface of the semiconductor die. The like plurality of conductive interconnection leads have tips which project beyond the surface of the like plurality of conductive interconnection leads toward the plurality of conductive contact bumps. The tips of one of the like plurality of conductive interconnection leads are each bonded to one of the plurality of conductive contact bumps.

In a preferred form of the tape automated bonding structure, the plurality of conductive contact bumps are, formed from a ductile material having a first hardness. The like plurality of conductive interconnection leads is formed from a material having a second hardness greater than the first hardness. The plurality of conductive contact bumps and the like plurality of conductive interconnection leads are bonded together with each tip penetrating into its associated one of the plurality of conductive contact bumps.

In the process of this invention, a semiconductor die having a surface and a plurality of conductive contact bumps on the surface of said semiconductor die and extending above the surface is provided. A like plurality of conductive interconnection leads having a surface facing toward the surface of the semiconductor die is provided. The like plurality of conductive interconnection leads have tips which project beyond the surface of the like plurality of conductive interconnection leads. The like plurality of conductive leads are positioned with their surfaces facing toward the plurality of conductive contact bumps and the projecting tip of one of each of the like plurality of conductive leads engaging one of the plurality of contacts. The projecting tips of the plurality of conductive leads are urged against the plurality of conductive contact bumps. The projecting tips of the plurality of conductive interconnection leads and the plurality of conductive contact bumps are heated to form a metallurgical bond between each projecting tip and its associated conductive contact bump.

In a preferred form of the process, the plurality of conductive contact bumps is formed from a ductile material having a first hardness. At least the projecting tips of the like plurality of conductive interconnection leads are formed from a material having a second hardness greater than the first hardness. The plurality of conductive contact bumps and the like plurality of conductive interconnection leads are urged together so that the projecting tips of the plurality of conductive leads penetrate into the plurality of conductive contact bumps.

The process provides a stronger bond between the conductive contact bumps and the conductive interconnection leads than conventional tape automated bonding processes. The conductive contact bumps and the portion of the tips of the conductive interconnection leads extending above the conductive contact bumps space the conductive interconnection leads above the surface of the semiconductor die sufficiently so that no shorting of the conductive interconnection leads against the semiconductor die due to drooping during subsequent heat treating of the interconnection structure results.

The attainment of the foregoing and related objects, advantages and features of the invention should be more readily apparent to those skilled in the art after review of the following more detailed description of the invention, taken together with the drawings, in which:

DETAILED DESCRIPTION OF THE INVENTION

Figure 1:
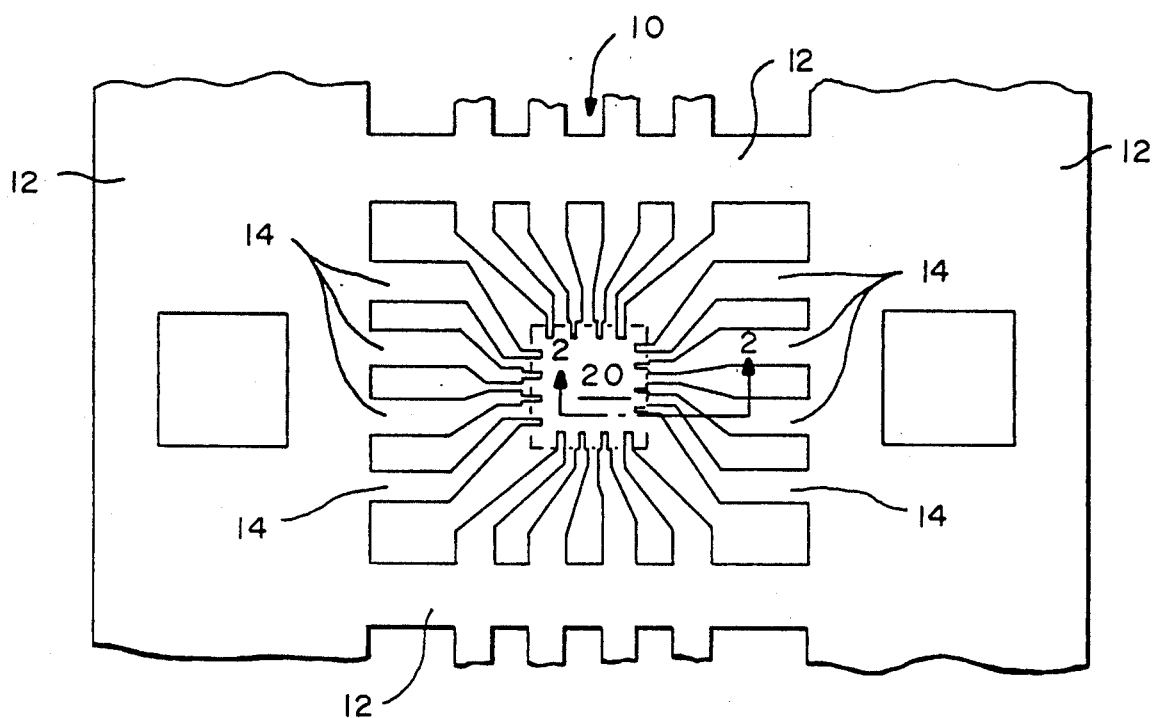
FIG. 1 is a plan view of a tape automated bonding structure in accordance with the invention.
Figure 2:
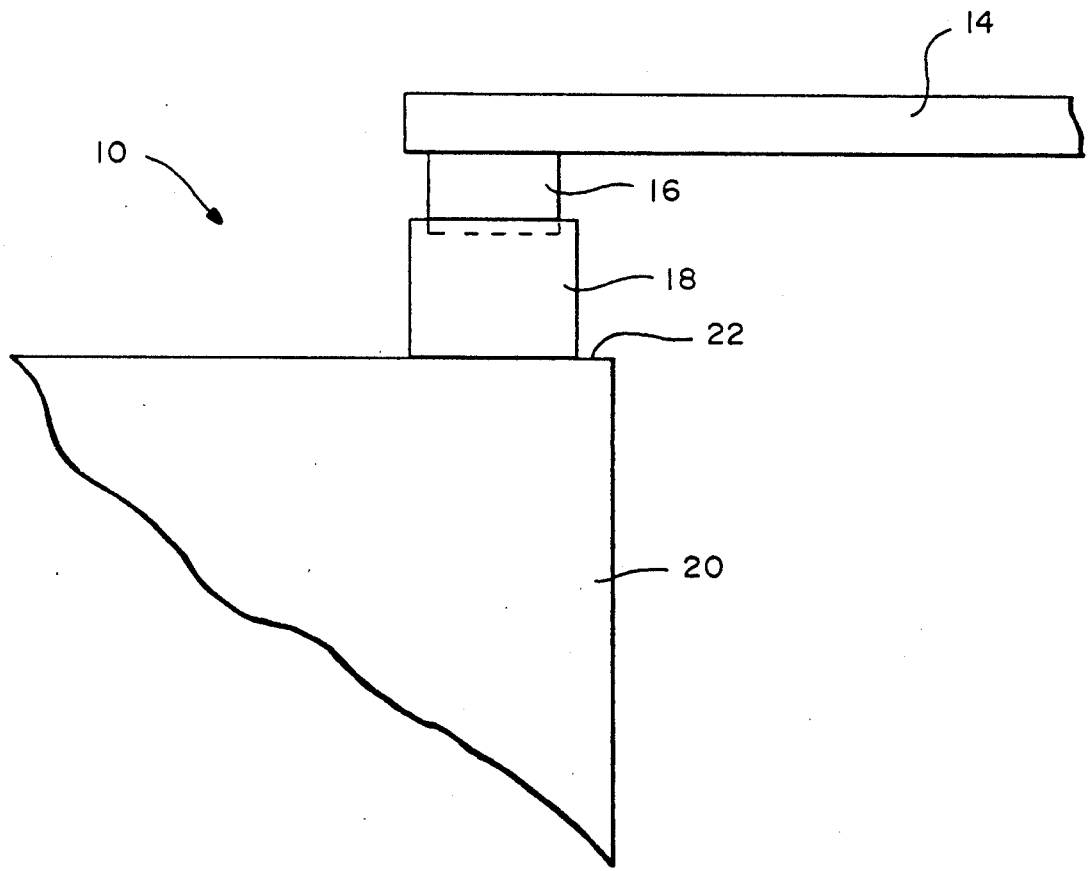
FIG. 2 is a cross-section view, taken along the line 2—2 in FIG. 1.
Figure 3:
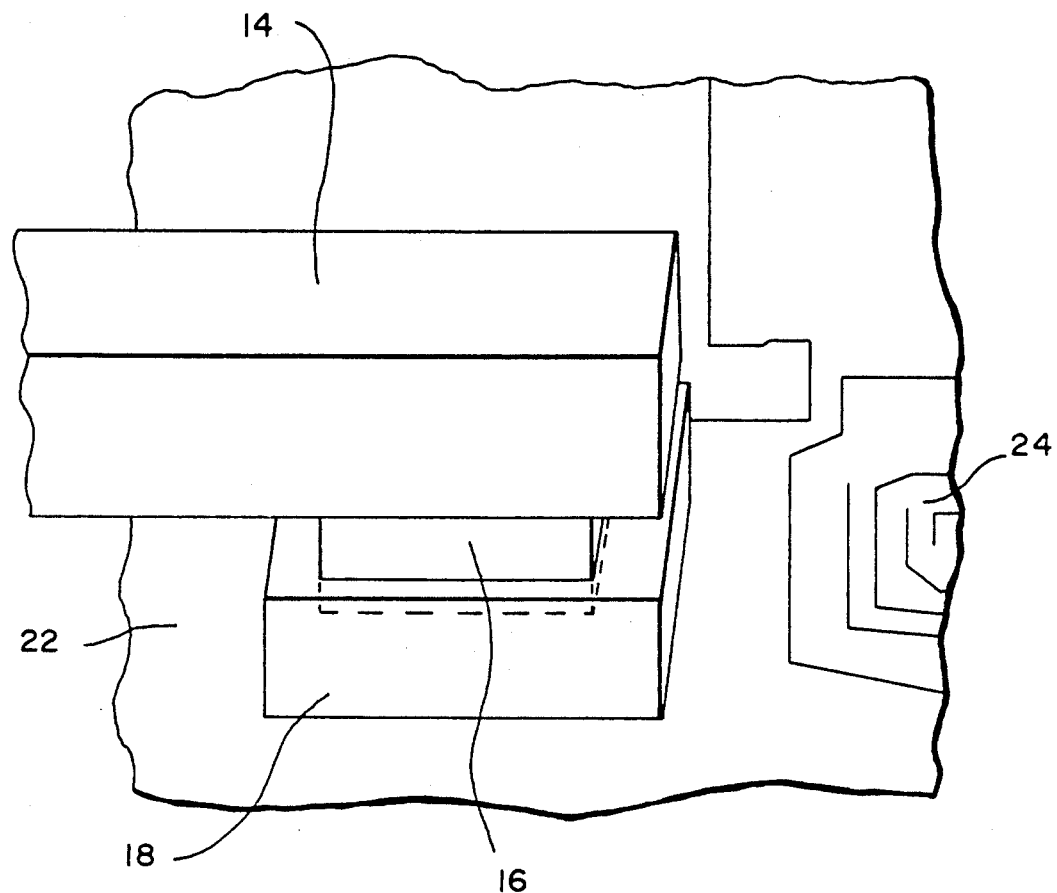
FIG. 3 is an enlarged perspective view of a portion of the structure shown in FIGS. 1 and 2.

Turning now to the drawings, more particularly to FIGS. 1-3, there is shown a tape automated bonding structure 10 in accordance with the invention. A flexible tape 12 has a plurality of conductive leads 14 having tips 16 arranged in a generally rectangular pattern corresponding to bumped contacts 18 on semiconductor die 20. The tips 16 of the conductive leads 14 are configured as bumps extending from the remainder of each conductive lead 14. In practice, the tape and the conductive leads 14 are formed from copper having a thickness of about 1.6 mils (thousandths of an inch) with the tips, also of copper, extending about 1.2 mils above the remainder of the conductive leads. The bumped contacts 18 on the semiconductor die 20 are formed from gold and typically have a thickness of about 1 mil.

Figure 4:
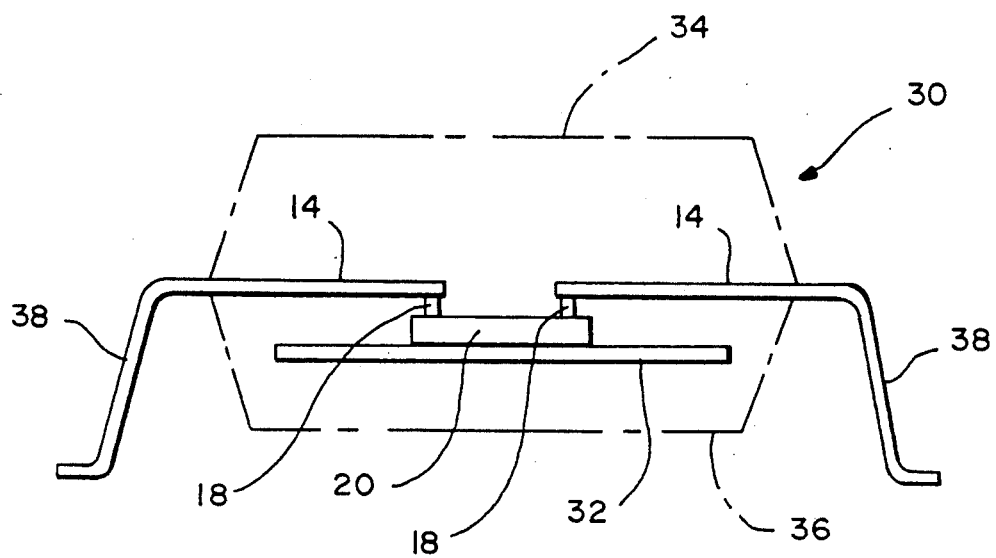
FIG. 4 is a cross-section view of a semiconductor die package incorporating the tape automated bonding structure of FIGS. 1-3.

The tips 16 of the conductive leads 14 are gang bonded to the bumped contacts 18 on the semiconductor die 20 by positioning the tips 16 in registration over each bumped contact and applying heat and pressure to urge the tips 16 and the bumped contacts together, thus forming a thermocompression bond. As is best shown in FIGS. 2 and 3, when the thermocompression bond is formed, the harder copper tips 16 penetrate into the gold bumped contacts. The bumped contacts 18 and the remainder of the tips 16 that has not penetrated into the contacts 18 space the conductive leads 14 above surface 22 of the semiconductor die 20. Typically, the tips 16 penetrate into the gold bumped contacts about 0.8 mil. This penetration by the tips 16 into the bumped contacts 18 produces a stronger bond between the tips and the contacts 18 than obtained with prior art structures in which such penetration is not present. The spacing of the conductive leads above surface 22 of the semiconductor die obtained with this structure is somewhat greater than that obtained with typical prior art structures, and is adequate to prevent shorting to devices 24 formed in the semiconductor die by sagging when the structure 10 is heated during subsequent processing to form the package 30, shown in FIG. 4.

In the formation of the package 30, after the conductive leads 14 have their tips 16 attached to the semiconductor die 20, ends 32 of the conductive leads 14 are attached to a lead frame, such as by solder reflow bonding, a plastic top 34 and bottom 36 are positioned over and under the lead frame, and the top 34 and bottom 36 are heated to bond them together, forming an enclosure around the semiconductor die 20, the conductive leads 14 and the adjacent portions of the lead frame. The leads 37 are then cut from the remainder of the lead frame, and the protruding ends 38 are bent to form the configuration shown.

Figure 5:
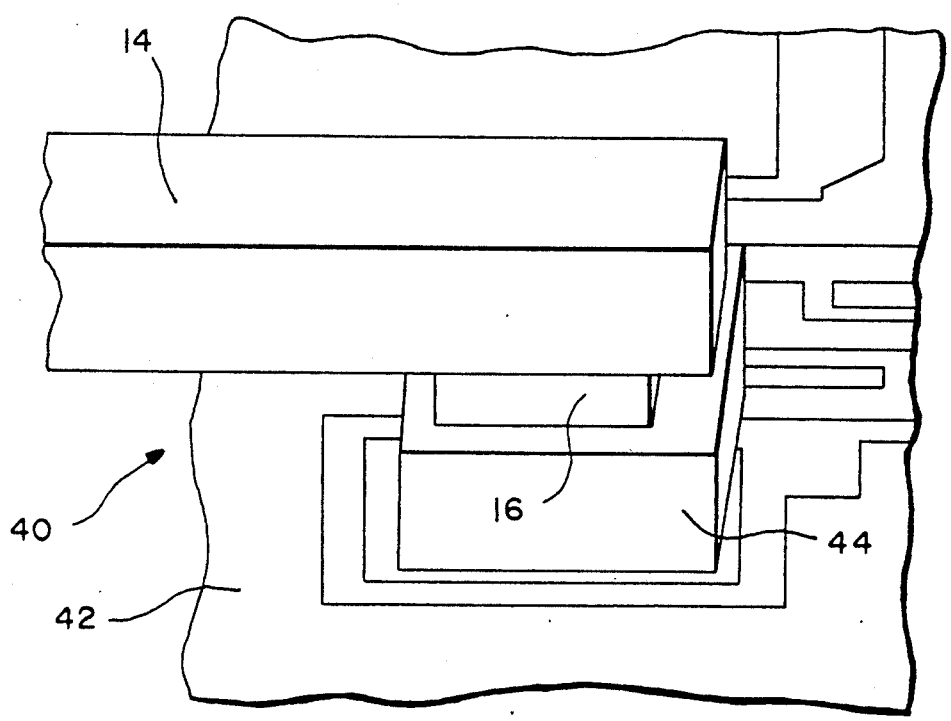
FIG. 5 is an enlarged perspective view similar to FIG. 3, but of another embodiment of a tape automated bonding structure in accordance with the invention.

FIG. 5 shows another form of a tape automated bonding interconnection structure 40 in accordance with the invention. In the structure 40, integrated circuit chip 42 has a plurality of copper bumped contacts 44 of the same dimensions as the gold bumped contacts 18 in FIGS. 1-3. A like plurality of copper conductive leads 14 with projecting tips 16 are each metallurgically bonded to one of the copper bumped contacts 44. The conductive leads 14 and projecting tips 16 have the same configuration as in FIGS. 1-3. Since the bumped contacts 44 and the tips 16 are formed from the same material, little or no penetration of the tips 16 into the bumped contacts 44 takes place. However, a stronger metallurgical bond is formed with this structure under the same fabrication conditions than with conventional planar conductive leads.

While Applicants do not wish to be bound by any particular theory of operation, it is believed that the projecting tips 16 serve to break up any oxides present on the bumped contacts 44. In the case of the FIG. 1-3 embodiment, the improved results are believed to be primarily due to the penetration of the copper tips 16 into the gold bumped contacts 18.

In a specific example, structures as shown in FIGS. 1-4 were prepared in the following manner: A tape carrying the conductive leads 14 is aligned over the semiconductor die 20, a perpendicularly applied force of 85 g/bump is applied between the conductive leads 14 and the bumps 18, and the tips 16 and bumps 18 are heated to 525° C. for 0.2 microseconds. The so prepared structures were subjected to pull tests according to the following procedure: Each lead to be tested is hooked with a miniature hook as close to the edge of the die 20 as possible and pulled perpendicular to the surface of the die 20. The amount of force required to separate the lead 14 from the bump 18 is measured by a load cell calibrated from 0 to 100 grams. For comparative purposes, structures prepared in the same manner except that a flat tape having no projecting tips was employed were also subjected to the pull tests. For each structure, at least 1000 parts were prepared, and 25 samples were randomly chosen for the pull tests. A total of 14 leads on each sample were subjected to the pull test. The results obtained are shown in the following table.

| Type | Avg. | Std. Dev. | Max | Min | #40 |
|---|---|---|---|---|---|
| Flat Tape-Au Bump | 39.3 | 6.2 | 51.2 | 25.8 | 64 |
| Bumped Tape-Au Bump | 59.0 | 7.6 | 73.0 | 44.5 | 0 |
| Bumped Tape-Cu Bump | 58.5 | 11.3 | 76.0 | 29.3 | 9 |

These results show that the structure of the present invention, employing a bumped tape to form bonds with the contact bumps on the semiconductor die, produced a substantially stronger bond than the comparable structure without the bumped tape. While best results are obtained using a bumped tape with a softer material for the contact bumps than used for the bumped tape, the results show that significant bond improvement is also obtained with the same material forming both the bumped tape and the contact bumps.

The spacing of the conductive leads above the die surface was measured after the completion of bonding for the flat tape and the bumped tape and gold contact bumps in both cases. An average spacing of 0.865 mil was obtained with the flat tape and an average of 1.29 mils was obtained for the bumped tape.

It should now be readily apparent to those skilled in the art that a novel tape automated bonding structure and process capable of achieving the stated objects of the invention has been provided. The process of this invention produces a structure having a substantially increased bond between conductive leads and the contacts of a semiconductor die. Because the process produces a structure in which the conductive leads are spaced an increased distance above the top surface of the semiconductor die, shorting to the semiconductor die surface from drooping when the structure is heated during subsequent processing does not occur.

It should further be apparent to those skilled in the art that various changes in form and details of the invention as shown and described may be made. It is intended that such changes be included within the spirit and scope of the claims appended hereto.

What is claimed is:

1. An interconnection structure, which comprises a semiconductor die having a surface and a plurality of conductive contact bumps on the surface of said semiconductor die and extending above the surface, a like plurality of conductive interconnection leads having a principal portion extending along an entire length of said like plurality of conductive interconnection leads and terminating in a distal end, the principal portion having a lead surface facing toward the surface of said semiconductor die, said like plurality of conductive interconnection leads having tips defined by additional material on the principal portion, giving a region at the distal end of greater thickness than a remainder of said principal portion, which tips project beyond the lead surface of the remainder toward said plurality of conductive contact bumps, said plurality of contact bumps being of the same material as the tips, or said plurality of conductive contact bumps being formed from a ductile material having a first hardness, said like plurality of conductive interconnection leads having at least their tips formed from a material having a second hardness greater than the first hardness and the tips of said like plurality of conductive interconnection leads being bonded with each tip penetrating into its associated one of said plurality of conductive contact bumps, the tips of one of said like plurality of conductive interconnection leads each being bonded to one of said plurality of conductive contact bumps.

2. The interconnection structure of claim 1 in which said plurality of conductive contact bumps are formed from a ductile material having a first hardness, said like plurality of conductive interconnection leads have at least their tips formed from a material having a second hardness greater than the first hardness and the tips of said like plurality of conductive interconnection leads are bonded with each tip penetrating into its associated one of said plurality of conductive contact bumps.

3. The interconnection structure of claim 2 in which at least the tips of said like plurality of conductive interconnection leads are formed from copper.

4. The interconnection structure of claim 3 in which said plurality of conductive contact bumps are formed from gold.

5. The interconnection structure of claim 1 in which said plurality of conductive contact bumps are formed from gold.

6. A semiconductor device package, which comprises the interconnection structure of claim 1 and an enclosure around at least said semiconductor die and a first portion of each of said conductive interconnection leads including the projecting tips.

7. The interconnection structure of claim 1 in which said plurality of conductive contact bumps and at least the projecting tips of said conductive interconnection leads are formed from the same conductive material.

8. The interconnection structure of claim 7 in which said plurality of conductive contact bumps and at least the projecting tips of said conductive interconnection leads are formed from copper.

9. A process for forming an interconnection structure, which comprises providing a semiconductor die having a surface and a plurality of conductive contact bumps on the surface of said semiconductor die and extending from the surface, providing a like plurality of conductive interconnection leads having a principal portion extending along an entire length of said like plurality of conductive interconnection leads and terminating in a distal end, the principal portion having a lead surface which will face toward the surface of said semiconductor die, the like plurality of conductive interconnection leads having tips formed by lead contact bumps defined by additional material on the principal portion at the distal end, giving a region at the distal end of greater thickness than a remainder of the principal portion and which projects beyond the lead surface of the remainder, the plurality of conductive contact bumps being of the same material as the lead contact bumps, or said plurality of conductive contact bumps being formed from a ductile material having a first hardness, said like plurality of conductive interconnection leads having at least their lead contact bumps formed from a material having a second hardness greater than the first hardness, positioning the like plurality of conductive leads with their lead surfaces facing toward the plurality of conductive contact bumps and the lead contact bumps of one of each of the like plurality of conductive leads engaging one of the plurality of conductive contact bumps, urging the lead contact bumps of the plurality of conductive leads against the plurality of conductive contact bumps and heating the lead contact bumps of the plurality of conductive leads and the plurality of conductive contact bumps to form a metallurgical bond between each lead contact bump and its associated conductive contact bump, the lead contact bumps of the plurality of conductive interconnection leads being bonded with each lead contact bump penetrating into its associated one of said plurality of conductive contact bumps when said plurality of conductive contact bumps are formed from a ductile material having a first hardness and said like plurality of conductive interconnection leads have at least their lead contact bumps formed from a material having a second hardness greater than the first hardness.

10. The process of claim 9 in which said plurality of contact bumps are formed from a ductile material having a first hardness, said conductive interconnection leads have at least their lead contact bumps formed from a material having a second hardness greater than the first hardness and the lead contact bumps of the plurality of conductive leads are urged against the plurality of conductive contact bumps so that the lead contact bumps of the plurality of conductive leads penetrate into the plurality of conductive contact bumps.

11. The process of claim 10 in which at least the lead contact bumps of the like plurality of conductive interconnection leads are formed from copper.

12. The process of claim 11 in which the plurality of conductive contact bumps are formed from gold.

13. The process of claim 10 in which said plurality of conductive contact bumps are formed from gold.

14. The process of claim 9 in which the conductive contact bumps and at least the lead contact bumps of the like plurality of interconnection leads are formed from the same conductive material.

15. The process of claim 14 in which the conductive material is copper.

* * * * *